United States Patent
Yamada

(10) Patent No.: US 10,211,551 B2
(45) Date of Patent: Feb. 19, 2019

(54) ELECTRONIC CIRCUIT MODULE

(71) Applicant: OLYMPUS CORPORATION, Tokyo (JP)

(72) Inventor: Junya Yamada, Kawasaki (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/708,705

(22) Filed: Sep. 19, 2017

(65) Prior Publication Data

US 2018/0006388 A1    Jan. 4, 2018

Related U.S. Application Data

(63) Continuation of application No. PCT/JP2015/058930, filed on Mar. 24, 2015.

(51) Int. Cl.

| | | |
|---|---|---|
| H01B 7/02 | (2006.01) |
| H01R 12/59 | (2011.01) |
| H01R 9/05 | (2006.01) |
| H01R 13/646 | (2011.01) |
| H01R 31/08 | (2006.01) |
| H05K 1/18 | (2006.01) |
| H05K 7/00 | (2006.01) |
| H01R 12/50 | (2011.01) |
| H05K 1/02 | (2006.01) |

(52) U.S. Cl.
CPC ............... *H01R 12/59* (2013.01); *H01B 7/02* (2013.01); *H01R 9/05* (2013.01); *H01R 12/50* (2013.01); *H01R 13/646* (2013.01); *H01R 31/08* (2013.01); *H05K 1/028* (2013.01); *H05K 1/18* (2013.01); *H05K 1/181* (2013.01); *H05K 7/00* (2013.01)

(58) Field of Classification Search
USPC .................................................. 361/749, 748
See application file for complete search history.

(56) References Cited

U.S. PATENT DOCUMENTS

| | | | |
|---|---|---|---|
| 2011/0127079 A1 | 6/2011 | Negishi et al. | |
| 2011/0255250 A1* | 10/2011 | Dinh | G03B 15/03 361/749 |
| 2016/0044784 A1* | 2/2016 | Matsuda | H05K 1/142 361/750 |

FOREIGN PATENT DOCUMENTS

| | | |
|---|---|---|
| JP | 6311745 Y2 | 4/1988 |
| JP | 5-327169 A | 12/1993 |
| JP | 3000448 U | 8/1994 |

(Continued)

OTHER PUBLICATIONS

International Search Report dated Jun. 16, 2015 in PCT/JP2015/058930.

*Primary Examiner* — Andargie M Aychillhum
(74) *Attorney, Agent, or Firm* — Scully, Scott, Murphy & Presser, P.C.

(57) ABSTRACT

An electronic circuit module includes: a substrate on which a wiring pattern having an electrode portion is formed; a cable having an external insulator and a conductor portion, at least a distal end side of the external insulator being removed to expose a conductor, an exposed portion of the conductor being defined as the conductor portion; and an electronic component having terminals at least on two opposed faces of the electronic component. At least one of the terminals of the electronic component is directly connected to the conductor portion, and is configured to be electrically connected to the electrode portion through the conductor portion.

11 Claims, 23 Drawing Sheets

(56) References Cited

FOREIGN PATENT DOCUMENTS

| JP | 2003-9368 A | 1/2003 |
|----|---|---|
| JP | 3596480 B2 | 9/2004 |
| JP | 2011-119409 A | 6/2011 |
| JP | 2013-51136 A | 3/2013 |

* cited by examiner

ELECTRONIC CIRCUIT MODULE

CROSS-REFERENCE TO RELATED APPLICATIONS

This application is a continuation of International Application No. PCT/JP2015/058930, filed on Mar. 24, 2015, the entire contents of which are incorporated herein by reference.

BACKGROUND

1. Technical Field

The disclosure relates to an electronic circuit module.

2. Related Art

Recently, various electronic devices, such as a digital camera, a mobile phone have been downsized. In the digital camera, the mobile phone, and the like, in order to improve portability, a cooling effect with respect to heat, or the like, a housing and an electronic circuit module contained in the housing have been downsized. Endoscopes configured to be inserted into a subject for observation have an electronic circuit module including an image sensor mounted on a tip end portion of an elongated flexible insertion tool. In such an endoscope, the diameter and the length of the tip end portion of the insertion tool is required to be reduced in order to reduce the burden on a patient, and there is a high demand for downsizing the electronic circuit module.

As a technology for providing the downsized electronic circuit modules, an electronic circuit module in which a core and a shield line of a coaxial cable is directly connected to a terminal of an electronic component on a substrate is disclosed (for example, refer to JP 2011-119409 A).

SUMMARY

In some embodiments, an electronic circuit module includes: a substrate on which a wiring pattern having an electrode portion is formed; a cable having an external insulator and a conductor portion, at least a distal end side of the external insulator being removed to expose a conductor, an exposed portion of the conductor being defined as the conductor portion; and an electronic component having terminals at least on two opposed faces of the electronic component. At least one of the terminals of the electronic component is directly connected to the conductor portion, and is configured to be electrically connected to the electrode portion through the conductor portion.

The above and other features, advantages and technical and industrial significance of this invention will be better understood by reading the following detailed description of presently preferred embodiments of the invention, when considered in connection with the accompanying drawings.

DETAILED DESCRIPTION

Figure 1A:
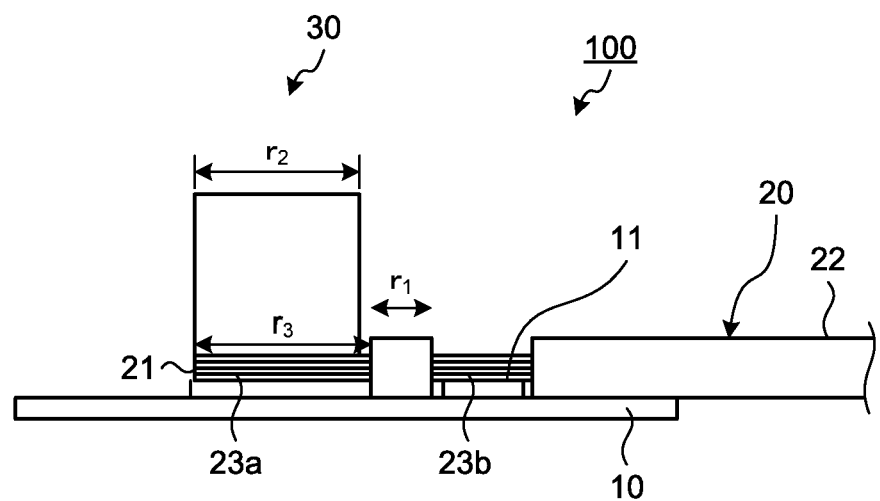
FIG. 1A is a side view of an electronic circuit module according to a first embodiment of the present invention.

Exemplary embodiments of the present invention will be described below in detail with reference to the drawings. The present invention is not limited by the embodiments. The same reference signs are used to designate the same elements throughout the drawings. The drawings are schematically illustrated, and a relationship between a thickness and a width of each member, a proportion of each of the members, and the like may be different from the reality. In the drawings, there are portions whose dimensional relationships or proportions are different from one another.

First Embodiment

Figure 1B:
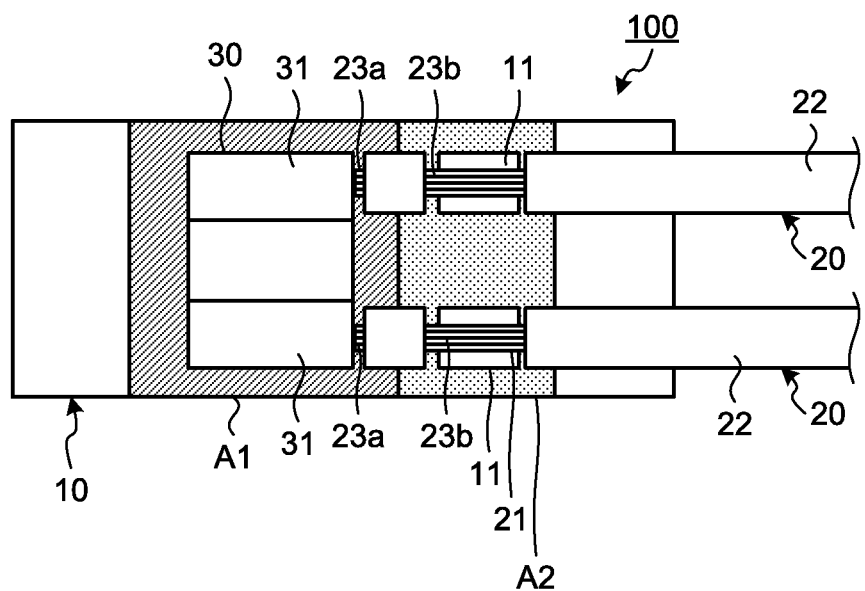
FIG. 1B is a top view of the electronic circuit module according to the first embodiment of the present invention.

FIG. 1A is a side view of an electronic circuit module according to a first embodiment of the present invention. FIG. 1B is a top view of the electronic circuit module according to the first embodiment of the present invention. An electronic circuit module 100 according to the first embodiment of the present invention includes a substrate 10 on which a wiring pattern having an electrode portion 11 is formed, two solid wire cables 20, each of which includes an external insulator 22 having two portions removed to expose a core 21, and an electronic component 30 having terminals on opposed faces. The removal of the insulator is performed, for example, by using laser processing, but is not limited thereto. The insulator may be removed or peeled off by etching or machine processing using a blade such as a cutter.

The substrate 10 has a plate shape. As the substrate 10, a flexible printed circuit board, a ceramic substrate, a glass epoxy substrate, a glass substrate, a silicon substrate, or the like is employed. Two electrode portions 11 to which the solid wire cables 20 are connected are arranged on the substrate 10. The wiring pattern is formed on the surface of the substrate 10 on which the electrode portions 11 are arranged, but is not illustrated.

The solid wire cable 20 includes the core 21 and the external insulator 22 covering the core 21. In the solid wire cable 20, the external insulator 22 is removed in two portions to expose the core 21. One of the exposed portions of the core 21 on a distal end side is a first conductor portion 23a, and the other of the exposed portions of the core 21 on a base end side from the first conductor portion 23a is a second conductor portion 23b. It is preferable that a length r1 of the external insulator 22 between the first conductor portion 23a and the second conductor portion 23b is approximately 0.05 mm. In FIGS. 1A and 1B, solder connecting the electrode portion 11 to the second conductor portion 23b and connecting the electronic component 30 described below to the first conductor portion 23a is not illustrated.

In the electronic circuit module 100, the second conductor portion 23b on the base end side is connected to the electrode portion 11 by solder, and the electronic component 30 is connected onto the first conductor portion 23a on the distal end side. The first conductor portion 23a is connected to a terminal 31 formed on an end surface of the electronic component by solder. A length r3 of the first conductor portion 23a is a length which is approximately identical to a length r2 of the terminal 31 of the electronic component 30, and the first conductor portion 23a is connected to the terminal 31 to be in contact with the entire length of the terminal 31 of the electronic component 30 in a lengthwise direction. It is possible to hold the electronic component 30 insofar as the first conductor portion 23a is connected to the terminal 31 at least over approximately a half of the length r2 of the terminal 31. From the viewpoint of connection reliability, it is preferable that the first conductor portion 23a is connected to the terminal 31 to be greater than or equal to 80% of the length r2 of the terminal 31. It is preferable that an end portion of the first conductor portion 23a does not protrude to a front side from the electronic component 30 (a left side in FIGS. 1A and 1B). From the viewpoint described above, the length r3 of the first conductor portion 23a is greater than or equal to 50% of the length r2 of the terminal 31, and is preferably greater than or equal to 80%.

An area A2 required for the connection of the solid wire cable 20 is illustrated in FIG. 1B, and is less than an area, which is represented by A1, required for the mounting of the electronic component 30. The electronic component 30 is connected to the first conductor portion 23a exposed to the end portion, and thus, the electronic component 30 mounted on the substrate 10 is connected to the solid wire cable 20, and therefore, it is possible to reduce the area required for the mounting by (A1-A2). As represented by A1 in FIG. 1B, a wiring pattern is arranged on the substrate 10 under the first conductor portion 23a to which the electronic component 30 is connected.

Figure 2:
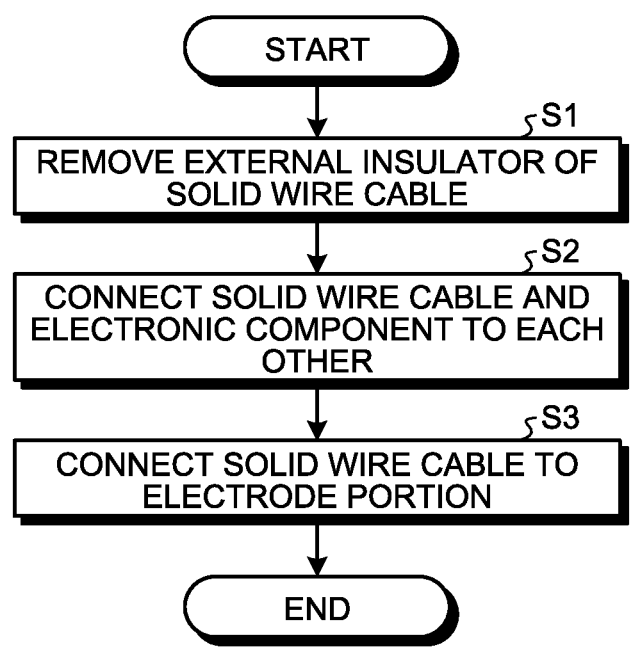
FIG. 2 is a flowchart illustrating a manufacturing process of the electronic circuit module according to the first embodiment of the present invention.
Figure 3A:
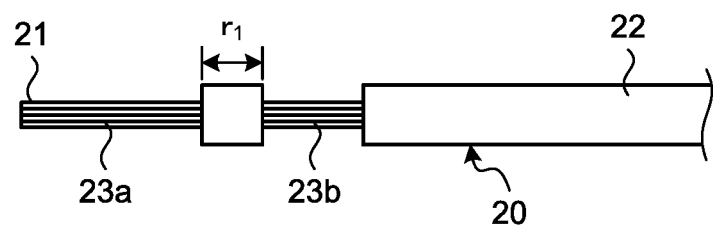
FIG. 3A is a diagram illustrating the manufacturing process of the electronic circuit module according to the first embodiment of the present invention.
Figure 3B:
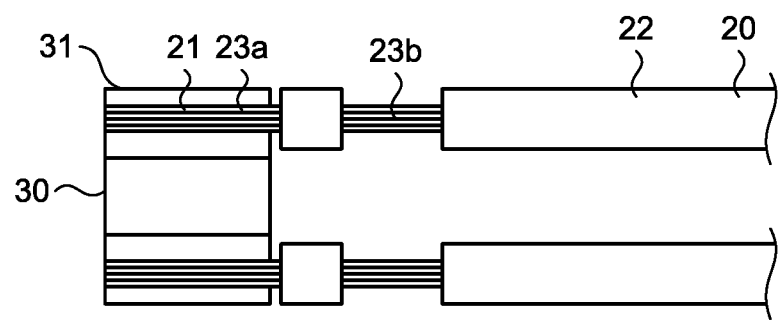
FIG. 3B is a diagram illustrating the manufacturing process of the electronic circuit module according to the first embodiment of the present invention.
Figure 3C:
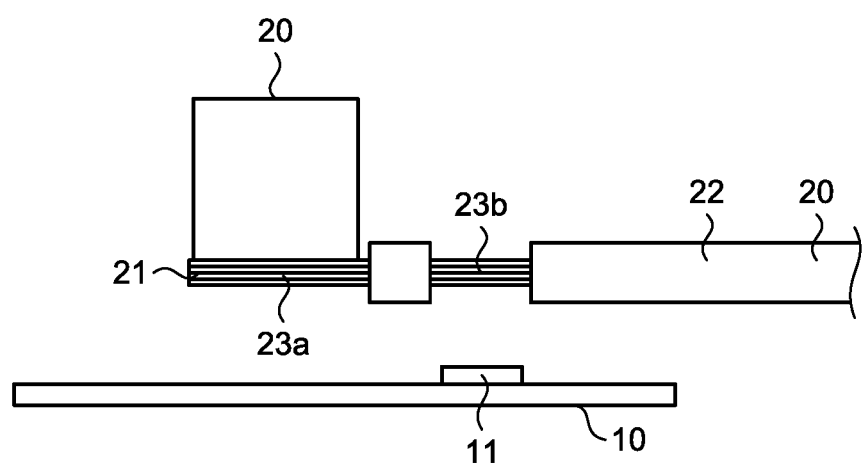
FIG. 3C is a diagram illustrating the manufacturing process of the electronic circuit module according to the first embodiment of the present invention.

Next, a manufacturing method of the electronic circuit module 100 will be described with reference to FIG. 2, and FIG. 3A to FIG. 3C. FIG. 2 is a flowchart illustrating a manufacturing process of the electronic circuit module 100 according to the first embodiment of the present invention. FIG. 3A to FIG. 3C are diagrams illustrating the manufacturing process of the electronic circuit module 100 according to the first embodiment of the present invention.

First, as illustrated in FIG. 3A, the external insulator 22 of the solid wire cable 20 is removed, and the core 21 is exposed (Step S1). The removal of the external insulator 22 is performed to set the first conductor portion 23a and the second conductor portion 23b to be a predetermined length.

After the external insulator 22 is removed (Step S1), the solid wire cable 20 and the electronic component 30 are connected to each other (Step S2). As illustrated in FIG. 3B, the first conductor portion 23a is positioned on the terminal 31 of the electronic component 30 covered with the solder, and the solder is melted by heating, and thus, the solid wire cable 20 and the electronic component 30 are connected to each other.

After the solid wire cable 20 and the electronic component 30 are connected to each other (Step S2), the solid wire cable 20 is connected to the electrode portion 11 (Step S3). As illustrated in FIG. 3C, the second conductor portion 23b is positioned on the electrode portion 11 of the substrate 10 covered with the solder, and the solder is melted by heating, and thus, the solid wire cable 20 and the electrode portion 11 are connected to each other. At this time, for example, a conductive member such as ACP or ACF is also capable of being used as a member used for the connection, in addition to the solder. Alternatively, solder having a low melting point rather than the solder used in Step S2 may be used.

Since the electronic circuit module 100 according to the first embodiment is capable of reducing the area required for mounting the solid wire cable 20 and the electronic component 30 onto the substrate 10, it is possible to provide the downsized electronic circuit module 100.

Figure 4A:
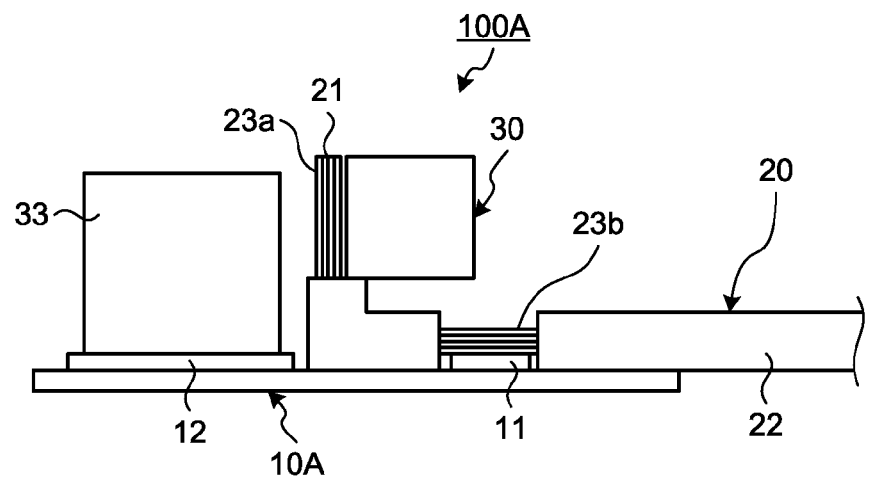
FIG. 4A is a side view of an electronic circuit module according to a first modification of the first embodiment of the present invention.
Figure 4B:
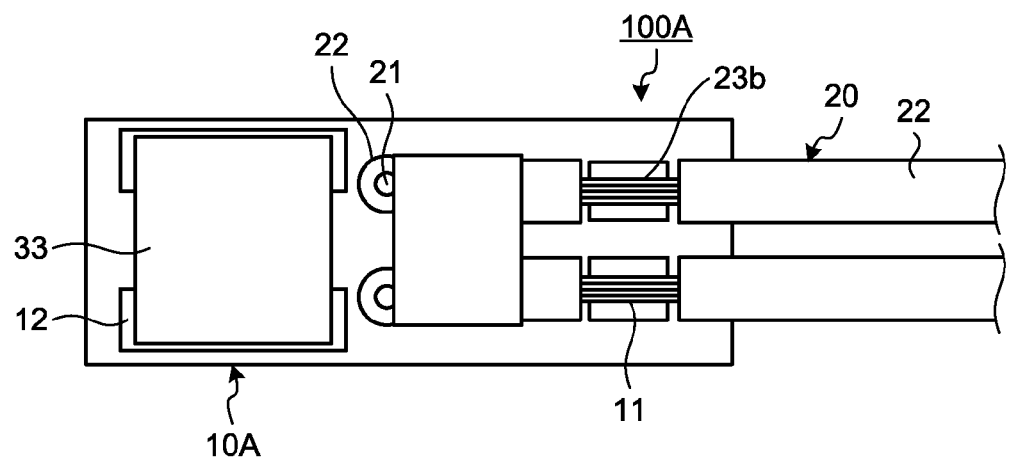
FIG. 4B is a top view of the electronic circuit module according to the first modification of the first embodiment of the present invention.

In the electronic circuit module 100 according to the first embodiment, the wiring pattern is formed on the substrate 10 under the first conductor portion 23a to which the electronic component 30 is connected, and other components or the like may be mounted. FIG. 4A is a side view of an electronic circuit module according to a first modification of the first embodiment of the present invention. FIG. 4B is a top view of the electronic circuit module according to the first modification of the first embodiment of the present invention.

In an electronic circuit module 100A according to the first modification of the first embodiment of the present invention, an electronic component 33 is mounted on a connection electrode 12 on a substrate 10A, in addition to the solid wire cable 20 and the electronic component 30. The solid wire cable 20 is bent in the external insulator 22 between the first conductor portion 23a and the second conductor portion 23b at approximately a right angle. Accordingly, it is possible to mount the electronic component 30 and the electronic component 33 on the substrate 10 without interfering with each other. In the electronic circuit module 100A according to the first modification of the first embodiment of the present invention, it is possible to reduce the area required for mounting the solid wire cable 20 and the electronic component 30 onto the substrate 10A, and thus, it is possible to provide the downsized electronic circuit module 100A.

Figure 5A:
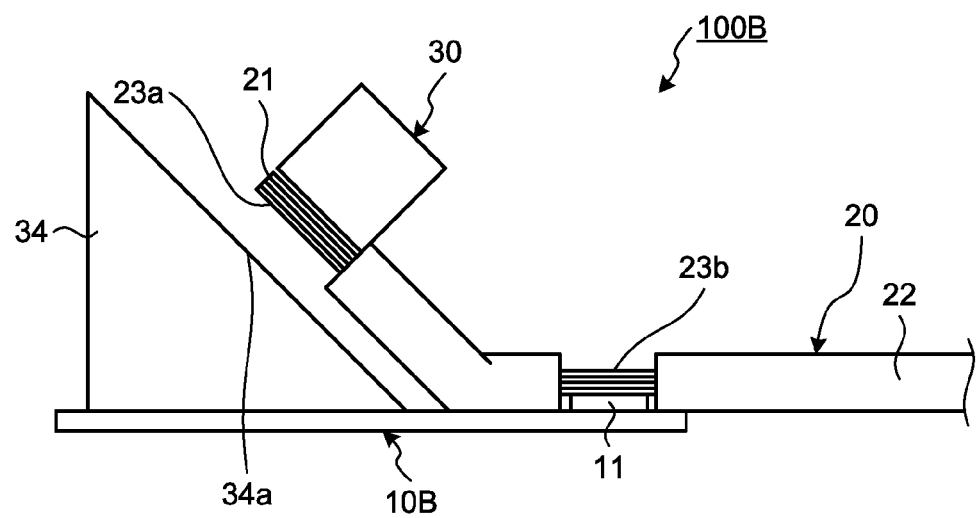
FIG. 5A is a side view of an electronic circuit module according to a second modification of the first embodiment of the present invention.
Figure 5B:
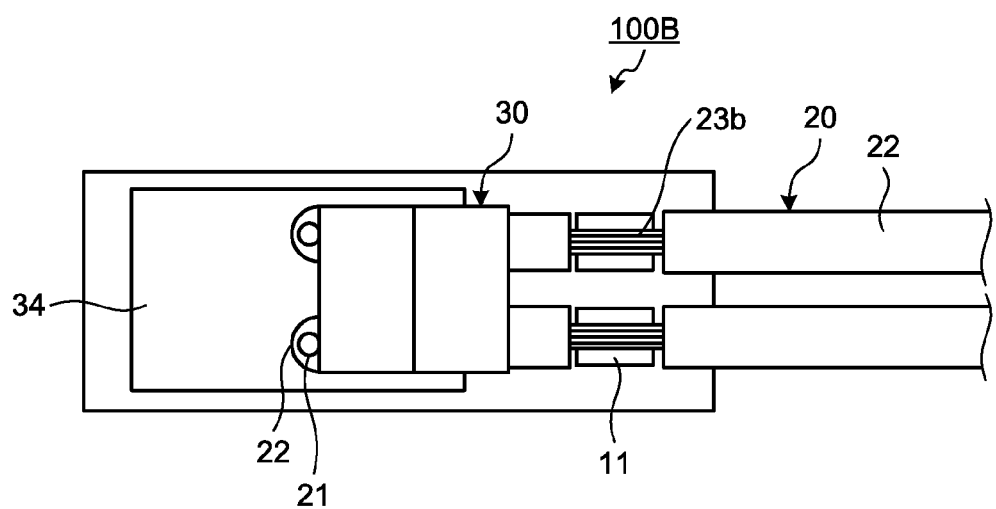
FIG. 5B is a top view of the electronic circuit module according to the second modification of the first embodiment of the present invention.

On the substrate, an optical component such as a prism may be mounted. FIG. 5A is a side view of an electronic circuit module according to a second modification of the first embodiment of the present invention. FIG. 5B is a top view of the electronic circuit module according to second modification of the first embodiment of the present invention.

In an electronic circuit module 100B according to the second modification of the first embodiment of the present invention, a prism 34 is mounted on a substrate 10B, in addition to the solid wire cable 20 and the electronic component 30. The solid wire cable 20 is bent in the external insulator 22 between the first conductor portion 23a and the second conductor portion 23b along a back side 34a of the prism 34. Accordingly, it is possible to mount the electronic component 30 and the prism 34 on the substrate 10 without interfering with each other. In the electronic circuit module 100B according to the second modification of the first embodiment of the present invention, it is possible to reduce the area required for mounting the solid wire cable 20 and the electronic component 30 onto the substrate 10B, and thus, it is possible to provide the downsized electronic circuit module 100B.

Figure 6:
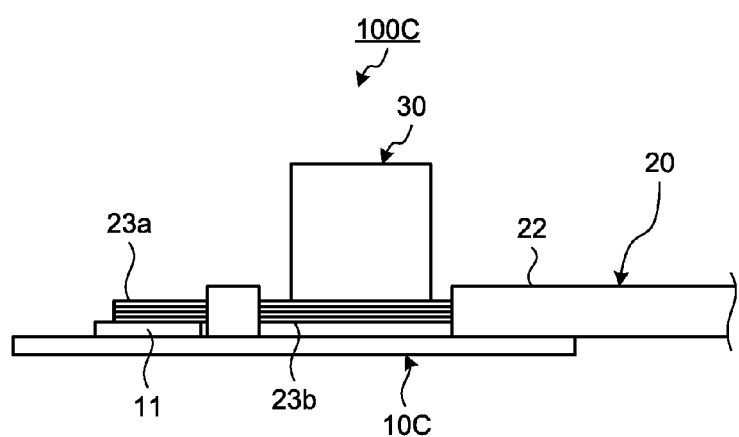
FIG. 6 is a side view of an electronic circuit module according to a third modification of the first embodiment of the present invention.

The electronic component 30 may be connected to the second conductor portion 23b, which is an exposed portion of the core 21 on the base end side. FIG. 6 is a side view of an electronic circuit module according to a third modification of the first embodiment of the present invention. An electronic circuit module 100C according to the third modification of the first embodiment of the present invention is different from the first embodiment in that the first conductor portion 23a is connected to the electrode portion 11, and the electronic component 30 is connected to the second conductor portion 23b.

In the electronic circuit module 100C according to the third modification of the first embodiment, it is possible to reduce the area required for mounting the solid wire cable 20 and the electronic component 30 onto a substrate 10C, and thus, it is possible to provide the downsized electronic circuit module 100C.

Figure 7:
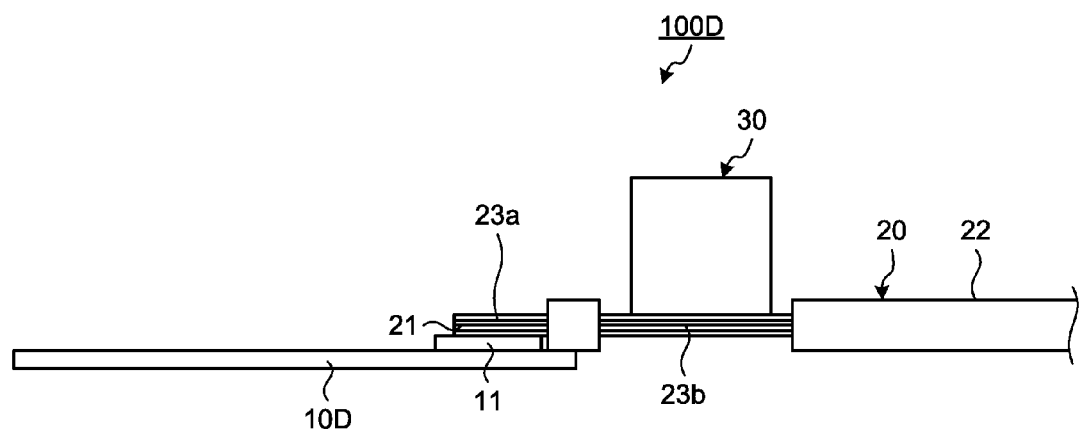
FIG. 7 is a side view of an electronic circuit module according to a fourth modification of the first embodiment of the present invention.

In the electronic circuit module 100C according to the third modification of the first embodiment, the substrate 10C extends, and the solid wire cable 20 is supported, under the second conductor portion 23b to which the electronic component 30 is connected, but it is not necessary that the substrate is disposed under the second conductor portion 23b to which the electronic component 30 is connected. FIG. 7 is a side view of an electronic circuit module according to a fourth modification of the first embodiment of the present invention. In an electronic circuit module 100D according to the fourth modification of first embodiment, a substrate 10D does not extend under the second conductor portion 23b to which the electronic component 30 is connected. The substrate 10D may be disposed in a lower portion of the external insulator 22 in which an end portion on the solid wire cable 20 side insulates at least the first conductor portion 23a and the second conductor portion 23b. In the electronic circuit module 100D according to the fourth modification of the first embodiment, it is possible to reduce the area required for mounting the solid wire cable 20 and the electronic component 30 onto the substrate 10D, and thus, it is possible to provide the downsized electronic circuit module 100D.

Figure 8:
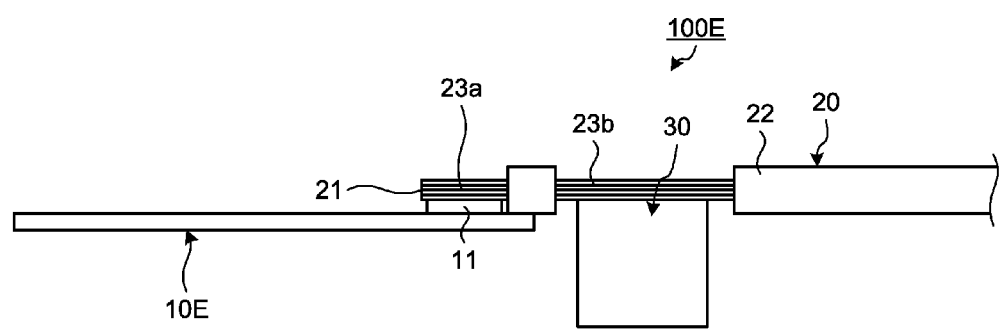
FIG. 8 is a side view of an electronic circuit module according to a fifth modification of the first embodiment of the present invention.

The electronic component 30 may be connected to a lower portion of the second conductor portion 23b. FIG. 8 is a side view of an electronic circuit module according to a fifth modification of the first embodiment of the present invention. As with the fourth modification, in an electronic circuit module 100E according to the fifth modification of the first embodiment, a substrate 10E does not extend under the second conductor portion 23b to which the electronic component 30 is connected, and the electronic component 30 is connected to the lower portion of the second conductor portion 23b. In the electronic circuit module 100E according to the fifth modification of the first embodiment, it is possible to reduce the area required for mounting the solid wire cable 20 and the electronic component 30 onto the substrate 10E, and thus, it is possible to provide the downsized electronic circuit module 100E. The electronic component 30 is connected to the lower portion of the second conductor portion 23b, and the electronic component 30 suspended from the second conductor portion 23b is inserted into an opening on the substrate which extends under the second conductor portion 23b.

Figure 9:
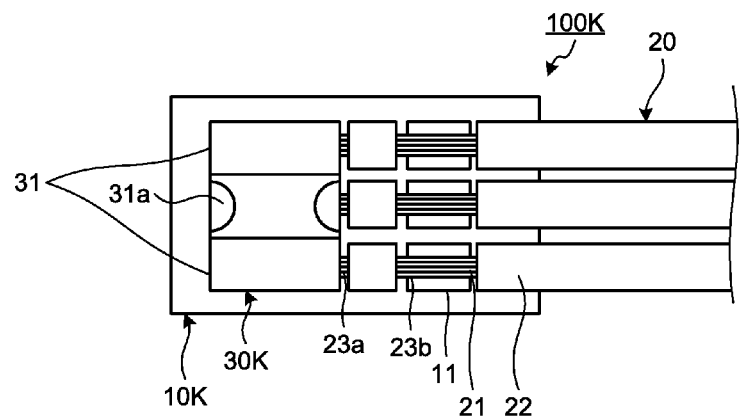
FIG. 9 is a top view of an electronic circuit module according to a sixth modification of the first embodiment of the present invention.

In the first embodiment described above and the first modification to the fifth modification of the first embodiment, the terminals 31 on the opposed faces of the electronic component 30 are respectively connected onto the cores 21 of the two solid wire cables 20, and the electronic component may be connected onto the cores 21 of three solid wire cables 20. FIG. 9 is a top view of an electronic circuit module according to a sixth modification of the first embodiment of the present invention.

Three electrode portions 11 respectively connecting three solid wire cables 20 are disposed on a substrate 10K of an electronic circuit module 100K. The solid wire cable 20 is connected to the electrode portion 11 at the second conductor portion 23b. An electronic component 30K includes a ground terminal 31a between the terminals 31, in addition to the terminals 31 on the opposed faces. An electronic component 30K is connected onto the first conductor portion 23a of three solid wire cables 20 by positioning the terminals 31 and 31a. In the electronic circuit module 100K according to the sixth modification of the first embodiment, it is possible to reduce the area required for mounting the solid wire cable 20 and the electronic component 30K onto the substrate 10K, and thus, it is possible to provide the downsized electronic circuit module 100K. In the sixth modification of the first embodiment, the electrode portion 11 is connected to the second conductor portion 23b, and the electronic component 30K is connected to the first conductor portion 23a. Alternatively, the first conductor portion 23a may be connected to the electrode portion 11, and the electronic component 30K may be connected onto the second conductor portion 23b.

Second Embodiment

Figure 10A:
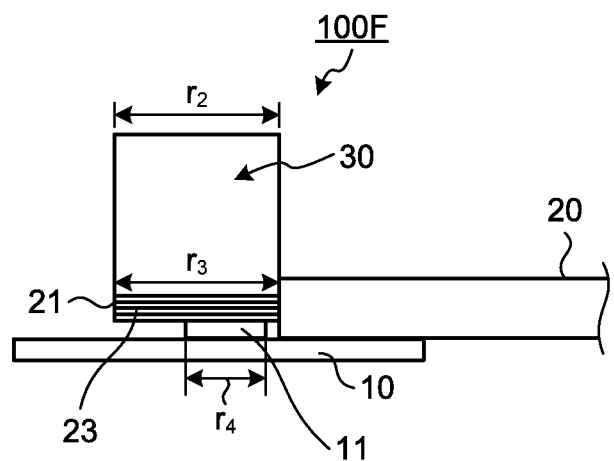
FIG. 10A is a side view of an electronic circuit module according to a second embodiment of the present invention.
Figure 10B:
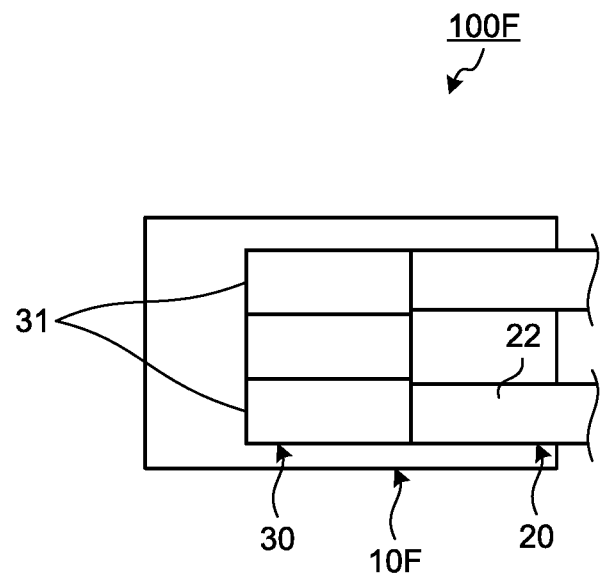
FIG. 10B is a top view of the electronic circuit module according to the second embodiment of the present invention.

In an electronic circuit module according to a second embodiment of the present invention, a conductor portion is formed in which only the external insulator 22 in the end portion of the solid wire cable 20 is removed, and thus, the core 21 is exposed. FIG. 10A is a side view of the electronic circuit module according to the second embodiment of the present invention. FIG. 10B is a top view of the electronic circuit module according to the second embodiment of the present invention.

In an electronic circuit module 100F, a conductor portion 23 is formed in which only the external insulator 22 in the end portion of the solid wire cable 20 is removed, and thus, the core 21 is exposed. The conductor portion 23 is connected to the electrode portion 11 of a substrate 10F by solder, and the electronic component 30 is directly connected onto the conductor portion 23 which is connected to the electrode portion 11 by solder.

The length r3 of the conductor portion 23 is a length which is approximately identical to the length r2 of the terminal 31 of the electronic component 30, and the conductor portion 23 is connected to the electrode portion 11 to be in contact with the entire length of the terminal 31 of the electronic component 30 in the lengthwise direction. The conductor portion 23 may have a length which is longer than at least a length r4 of the electrode portion 11, and may be connected to the electrode portion 11 over a half of the length r2 of the terminal 31. From the viewpoint of the connection reliability, it is preferable that the conductor portion 23 is connected to the electrode portion 11 to be greater than or equal to 80% of the length r2 of the terminal 31. An end portion of the conductor portion 23 is located and adjusted not to protrude to the front side from the electronic component 30 (in FIG. 10A and FIG. 10B, a left side). From the viewpoint described above, the length r3 of the conductor portion 23 is greater than or equal to the length r4 of the electrode portion 11, is greater than or equal to 50% of the length r2 of the terminal 31, and is preferably greater than or equal to 80%.

In the electronic circuit module 100F according to the second embodiment, it is possible to reduce the area required for mounting the solid wire cable 20 and the electronic component 30 onto the substrate 10F, and thus, it is possible to provide the downsized electronic circuit module 100F. Since only the external insulator 22 in the end portion of the solid wire cable 20 is removed, the manufacturing is further simplified.

Figure 11A:
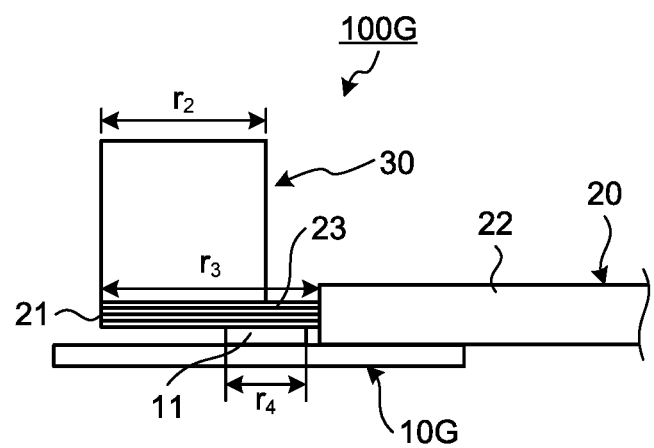
FIG. 11A is a side view of an electronic circuit module according to a first modification of the second embodiment of the present invention.
Figure 11B:
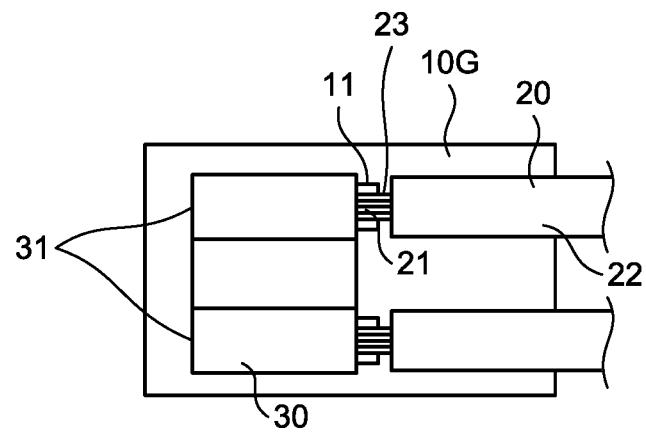
FIG. 11B is a top view of the electronic circuit module according to the first modification of the second embodiment of the present invention.

The length r3 of the conductor portion 23 may be longer than the length r2 of the terminal 31 of the electronic component 30. FIG. 11A is a side view of an electronic circuit module according to a first modification of the second embodiment of the present invention. FIG. 11B is a top view of the electronic circuit module according to the first modification of the second embodiment of the present invention.

In an electronic circuit module 100G according to the first modification of the second embodiment, the length r3 of the conductor portion 23 is longer than the length r2 of the terminal 31 of the electronic component 30. The end portion of the conductor portion 23 does not protrude to the front side from the electronic component 30 (in FIG. 11A and FIG. 11B, a left side). In the electronic circuit module 100G, as illustrated in FIG. 11B, it is possible to view the end portion of the electrode portion 11 from an upper side, and thus, it is possible to easily position the solid wire cable 20 to which the electronic component 30 is connected and the electrode portion 11.

Figure 12A:
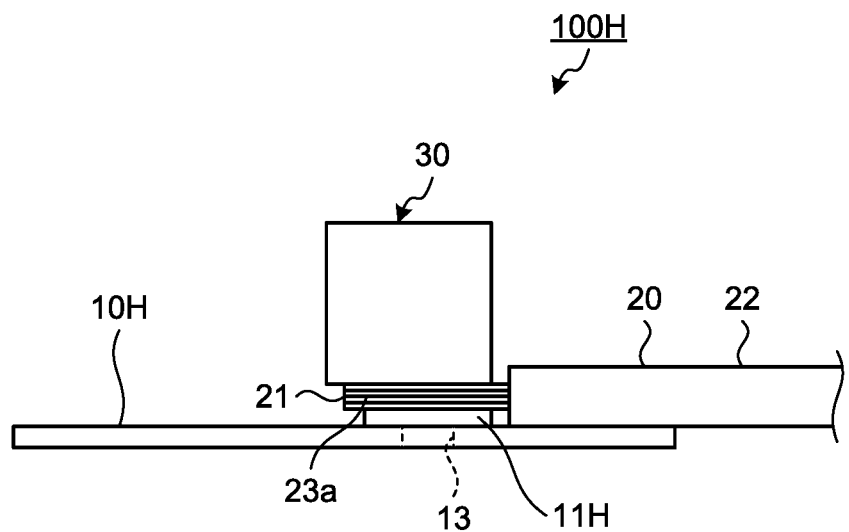
FIG. 12A is a side view of an electronic circuit module according to a second modification of the second embodiment of the present invention.
Figure 12B:
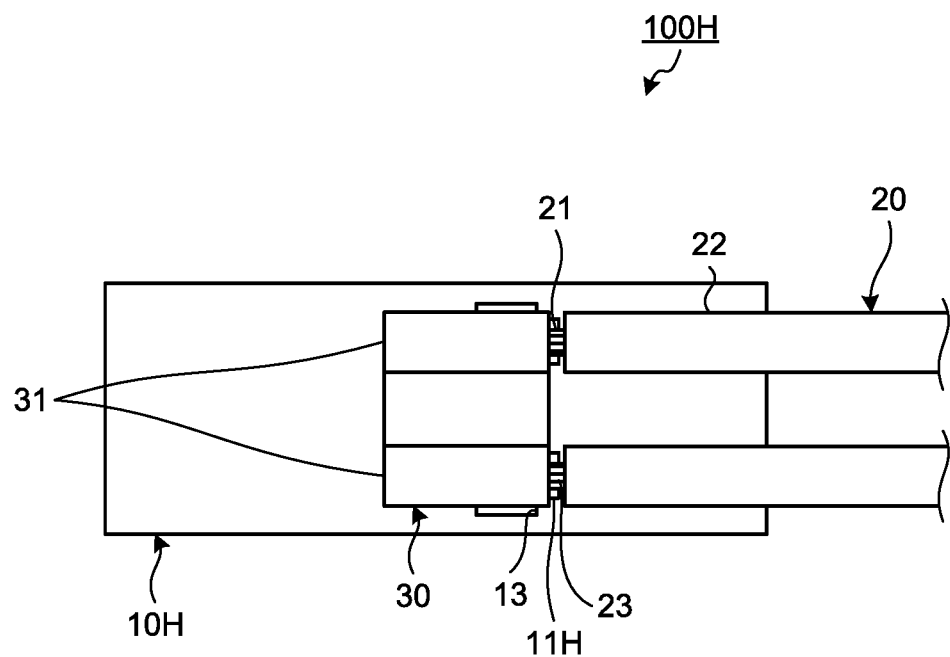
FIG. 12B is a top view of the electronic circuit module according to the second modification of the second embodiment of the present invention.
Figure 13:
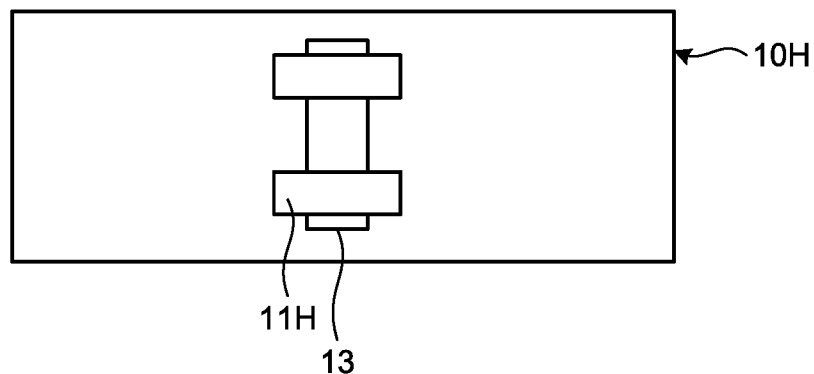
FIG. 13 is a top view of a substrate to be used in the electronic circuit module of FIG. 12A and FIG. 12B.

As described above, in general, the electrode portion and the conductor portion are positioned by being viewed from an upper side of a mounting surface or a horizontal direction, and it is possible to position the electrode portion and the conductor portion by being viewed from a lower side through the opening disposed on the substrate. FIG. 12A is a side view of an electronic circuit module according to a second modification of the second embodiment of the present invention. FIG. 12B is a top view of the electronic circuit module according to the second modification of the second embodiment of the present invention. FIG. 13 is a top view of a substrate to be used in the electronic circuit module of FIG. 12A and FIG. 12B.

In an electronic circuit module 100H according to the second modification of the second embodiment, a flexible printed circuit board is used as a substrate 10H. As illustrated in FIG. 13, an opening 13 is formed on the substrate 10H, and an electrode portion 11H as flying leads bridges the opening 13. In the electrode portion 11H, it is possible to connect the electronic component 30 and the electrode portion 11H by positioning the electronic component 30 and the electrode portion 11H from a lower side (in FIG. 12A, a lower side) through the opening 13, at the time of connecting the conductor portion 23 to which the electronic component 30.

Figure 14A:
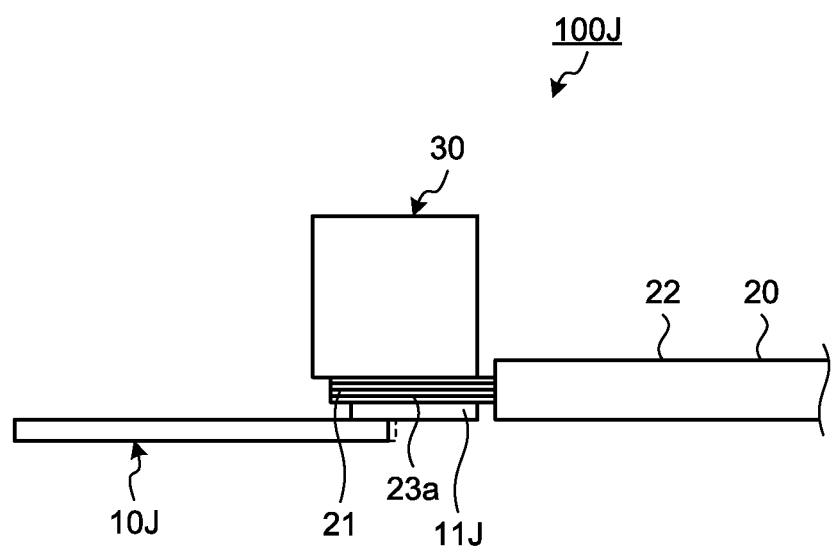
FIG. 14A is a side view of an electronic circuit module according to a third modification of the second embodiment of the present invention.
Figure 14B:
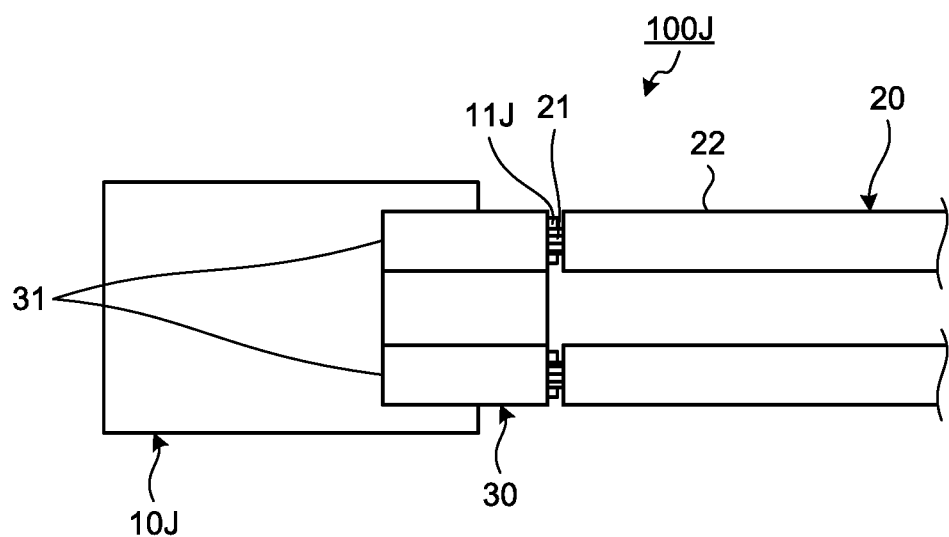
FIG. 14B is a top view of the electronic circuit module according to the third modification of the second embodiment of the present invention.
Figure 15:
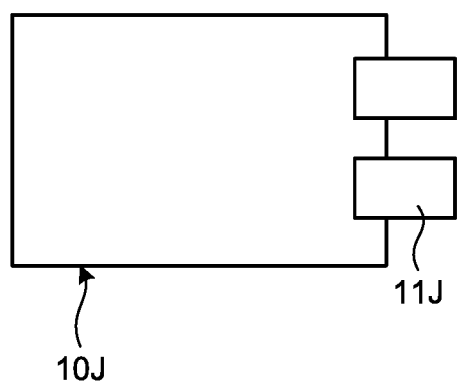
FIG. 15 is a top view of a substrate to be used in the electronic circuit module of FIG. 14A and FIG. 14B.

The electrode portion as flying leads may be disposed to protrude from an end portion of the substrate. FIG. 14A is a side view of an electronic circuit module according to a third modification of the second embodiment of the present invention. FIG. 14B is a top view of an electronic circuit module according to a fourth modification of the second embodiment of the present invention. FIG. 15 is a top view of a substrate to be used in the electronic circuit module of FIG. 14A and FIG. 14B.

In an electronic circuit module 100J according to the third modification of the second embodiment, a flexible printed circuit board is used as a substrate 10J, and as illustrated in FIG. 15, an electrode portion 11J as flying leads is formed to extend from an end portion of the substrate 10J. In the electrode portion 11J, it is possible to connect the electronic component 30 and the electrode portion 11J by positioning the electronic component 30 and the electrode portion 11J from the lower side (in FIG. 14A, a lower side), at the time of connecting the conductor portion 23 to which the electronic component 30 is connected.

Third Embodiment

Figure 16A:
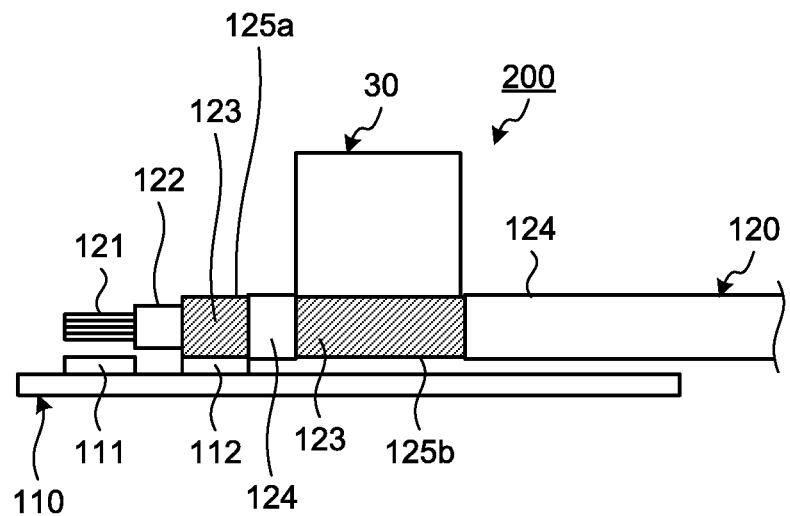
FIG. 16A is a side view of an electronic circuit module according to a third embodiment of the present invention.
Figure 16B:
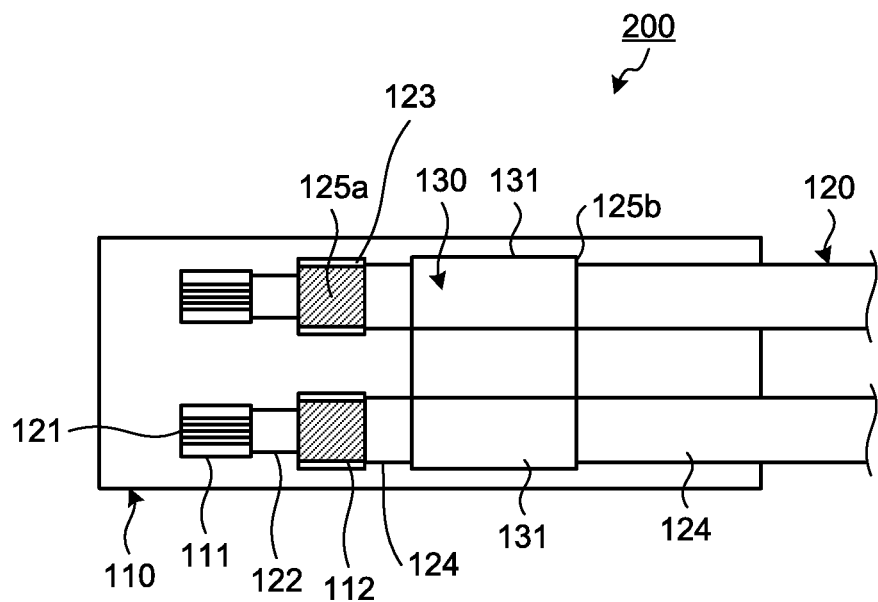
FIG. 16B is a top view of the electronic circuit module according to the third embodiment of the present invention.

In an electronic circuit module according to a third embodiment of the present invention, a coaxial cable is used as the cable. FIG. 16A is a side view of the electronic circuit module according to the third embodiment of the present invention. FIG. 16B is a top view of the electronic circuit module according to the third embodiment of the present invention.

In an electronic circuit module 200 according to the third embodiment of the present invention, a coaxial cable 120 is used as the cable. In the coaxial cable 120, a shield line 123 is formed on an outer circumference of a core 121 through an internal insulator 122, an outer circumference of the shield line 123 is covered with an external insulator 124. In an end portion of the coaxial cable 120, the core 121, the internal insulator 122, and the shield line 123 are exposed in a stepwise fashion. The external insulator 124 on the outer circumference of the shield line 123 is removed in two portions to form two exposed portions of the shield line 123. A distal end side of the two exposed portions of the shield line is a first conductor portion 125a, and a base end side of the two exposed portions is a second conductor portion 125b.

An electrode portion 111 connecting the core 121 and an electrode portion 112 connecting the shield line 123 are formed on the substrate 110. The core 121 and the first conductor portion 125a are respectively connected to the electrode portion 111 and the electrode portion 112 by solder, and an electronic component 130 is connected onto the second conductor portion 125b. The electronic component 130 includes terminals 131 on opposed faces, and the terminal 131 is connected to the second conductor portion 125b.

In the electronic circuit module 200 according to the third embodiment, it is possible to reduce the area required for mounting the cable 120 and the electronic component 130 onto the substrate 110, and thus, it is possible to provide the downsized electronic circuit module 200.

Figure 17:
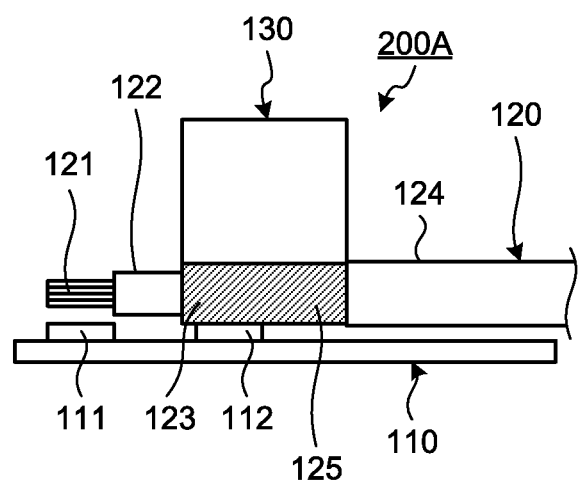
FIG. 17 is a side view of an electronic circuit module according to a first modification of the third embodiment of the present invention.

The shield line 123 of the coaxial cable 120 may be exposed in only one portion, and thus, a conductor portion may be formed. FIG. 17 is a side view of an electronic circuit module according to a first modification of the third embodiment of the present invention. In an electronic circuit module 200A, the core 121, the internal insulator 122, and the shield line 123 are exposed in a stepwise fashion in the end portion of the coaxial cable 120. The exposed portion of the shield line 123 functions as a conductor portion 125. The conductor portion 125 is connected to the electrode portion 112, and the electronic component 130 is connected onto the conductor portion 125.

In the electronic circuit module 200A according to the first modification of the third embodiment, it is possible to reduce the area required for mounting the cable 120 and the electronic component 130 onto the substrate 110, and thus, it is possible to provide the downsized electronic circuit module 200A. A connection portion such as the external insulator 124 of the cable 120 is small, and thus, it is possible to easily manufacture the electronic circuit module.

Figure 18A:
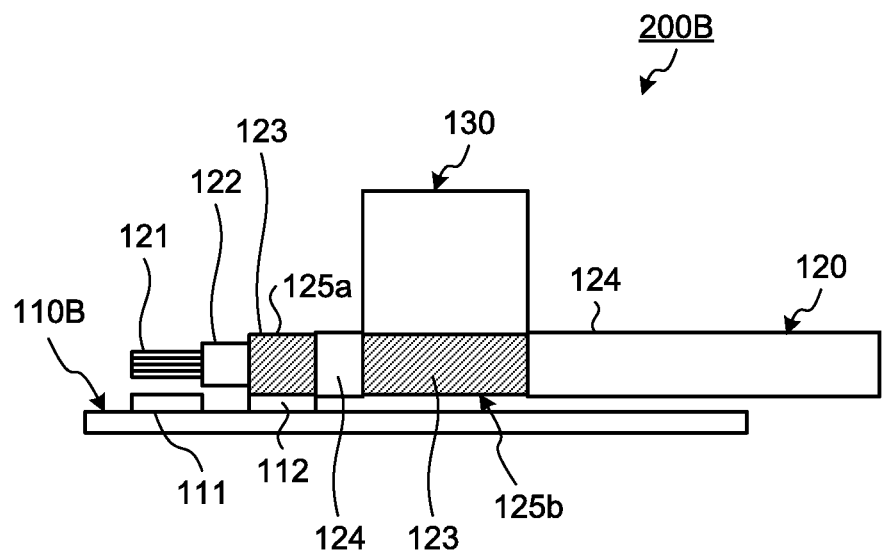
FIG. 18A is a side view of an electronic circuit module according to a second modification of the third embodiment of the present invention.
Figure 18B:
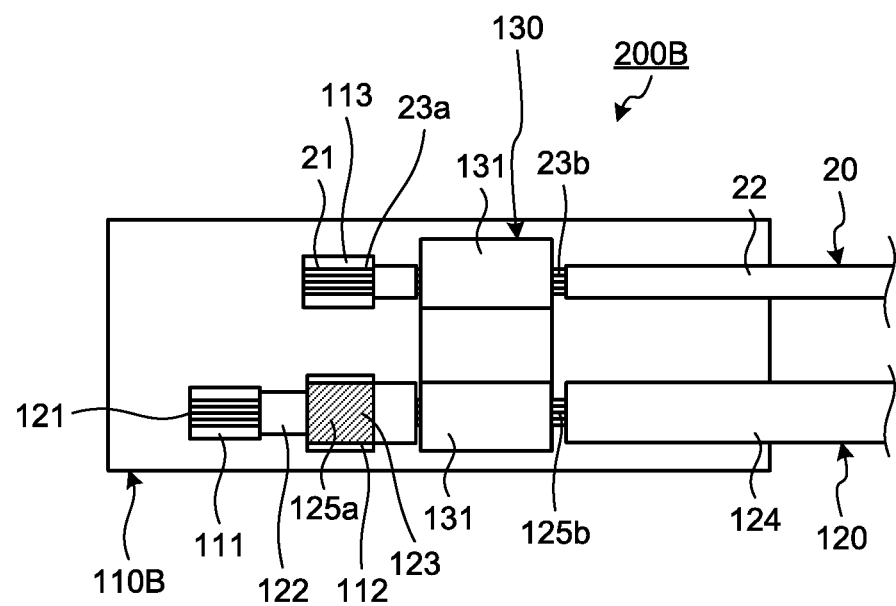
FIG. 18B is a top view of the electronic circuit module according to the second modification of the third embodiment of the present invention.
Figure 18C:
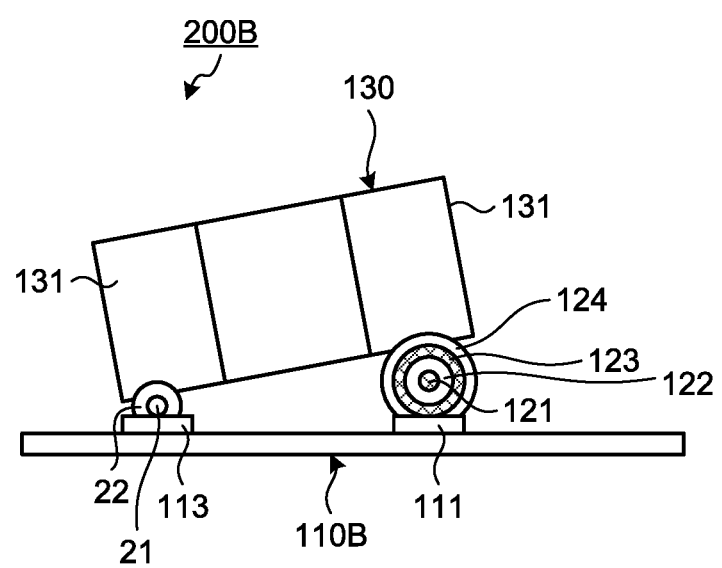
FIG. 18C is a front view of the electronic circuit module according to the second modification of the third embodiment of the present invention.

The electronic component 130 may be connected onto the coaxial cable 120 and the solid wire cable 20. FIG. 18A is a side view of an electronic circuit module according to a second modification of the third embodiment of the present invention. FIG. 18B is a top view of the electronic circuit module according to the second modification of the third embodiment of the present invention. FIG. 18C is a front view of the electronic circuit module according to the second modification of the third embodiment of the present invention.

In an electronic circuit module 200B according to the second modification of the third embodiment of the present invention, the solid wire cable 20 and the coaxial cable 120 are used. In the end portion of the coaxial cable 120, the external insulator 124 is removed such that the core 121, the internal insulator 122, and the shield line 123 are exposed in a stepwise fashion. The external insulator 124 on the outer circumference of the shield line 123 is removed in two portions to expose the shield line 123 at the first conductor portion 125a on the distal end side and at the second conductor portion 125b on the base end side from the first conductor portion 125a. In the solid wire cable 20, the external insulator 22 is removed in two portions to expose the core 21 at the first conductor portion 23a on the distal end side and at the second conductor portion 23b on the base end side from the first conductor portion 23a.

The electrode portion 111 connecting the core 121 of the coaxial cable 120, the electrode portion 112 connecting the shield line 123, and an electrode portion 113 connecting the core 21 of the solid wire cable 20 are formed on a substrate 110B. The core 121 and the first conductor portion 125a of the coaxial cable 120 are respectively connected to the electrode portion 111 and the electrode portion 112 by solder, and the first conductor portion 23a of the solid wire cable 20 is connected to the electrode portion 113 by solder. One of the opposed terminals 131 of the electronic component 130 is connected to the second conductor portion 125b of the coaxial cable 120, and the other of the terminals 131 is connected to the second conductor portion 23b of the solid wire cable 20.

In the electronic circuit module 200B according to the second modification of the third embodiment, it is possible to reduce the area required for mounting the solid wire cable 20, the coaxial cable 120, and the electronic component 130 onto the substrate 110B, and thus, it is possible to provide the downsized electronic circuit module 200B.

Each of the shield line 123 of the coaxial cable 120 and the core 21 of the solid wire cable 20 is exposed at only one portion to define the conductor portion. In such a case, the core 121 and the shield line 123 as the conductor portion of the coaxial cable 120 are respectively connected to the electrode portion 111 and the electrode portion 112, and the core 21 as the conductor portion of the solid wire cable 20 is connected to the electrode portion 113. One of the opposed terminals 131 of the electronic component 130 may be connected to the conductor portion of the coaxial cable 120, and the other of the terminals 131 may be connected to the conductor portion of the solid wire cable 20.

Fourth Embodiment

Figure 19A:
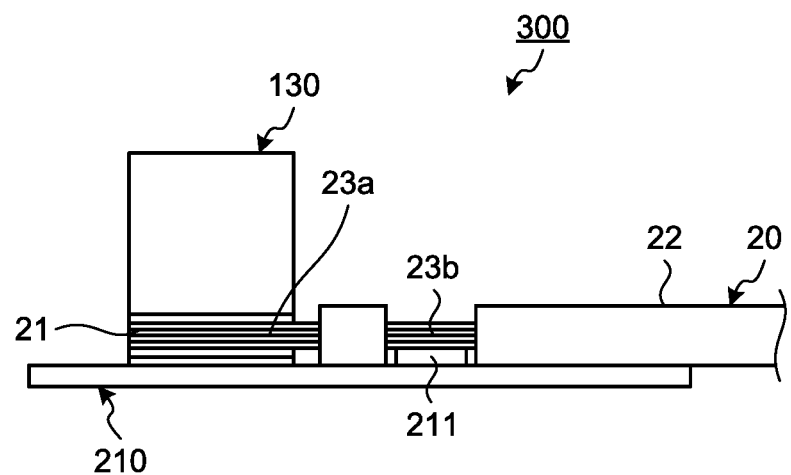
FIG. 19A is a side view of an electronic circuit module according to a fourth embodiment of the present invention.
Figure 19B:
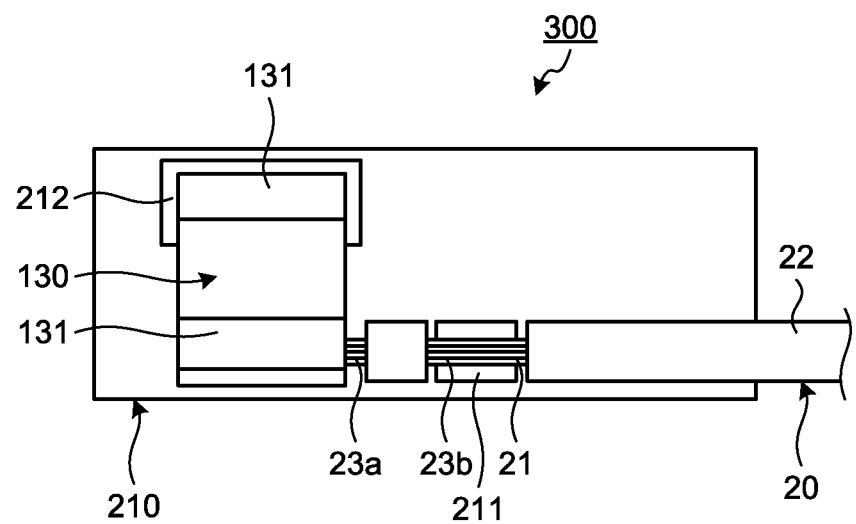
FIG. 19B is a top view of the electronic circuit module according to the fourth embodiment of the present invention.
Figure 19C:
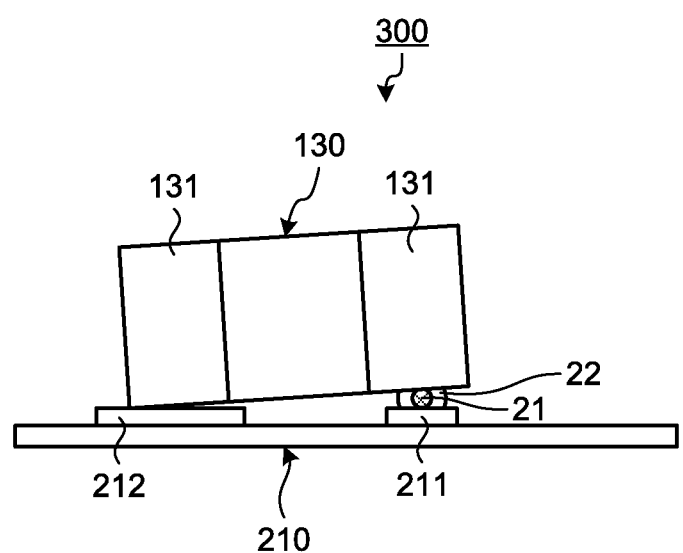
FIG. 19C is a front view of the electronic circuit module according to the fourth embodiment of the present invention.

In an electronic circuit module according to a fourth embodiment of the present invention, terminals of an electronic component are respectively connected onto a connection electrode and a core of a cable on a substrate. FIG. 19A is a side view of the electronic circuit module according to the fourth embodiment of the present invention. FIG. 19B is a top view of the electronic circuit module according to the fourth embodiment of the present invention. FIG. 19C is a front view of the electronic circuit module according to the fourth embodiment of the present invention.

An electronic circuit module 300 according to the fourth embodiment of the present invention includes one solid wire cable 20 whose external insulator 22 at the end portion is removed to expose the core 21, the electronic component 130 including the terminals 131 on the opposed faces, one electrode portion 211 to which the solid wire cable 20 is connected, and a substrate 210 including one connection electrode 212 to which the electronic component 130 is connected.

The electronic circuit module 300 includes the first conductor portion 23a where the core 21 is exposed on the distal end side, and the second conductor portion 23b where the core 21 is exposed on the base end side from the first conductor portion 23a. The second conductor portion 23b is connected to the electrode portion 211 by solder. The terminals 131 of the electronic component 130 are respectively connected to the connection electrode 212 and the first conductor portion 23a.

In the electronic circuit module 300 according to the fourth embodiment, it is possible to reduce the area required for mounting the solid wire cable 20 and the electronic component 130 onto the substrate 210, and thus, it is possible to provide the downsized electronic circuit module 300.

The core 21 of the solid wire cable 20 may be exposed in only one portion to form a conductor portion. In such a case, the core 21 may be connected to the electrode portion 211, one of the opposed terminals 131 of the electronic component 130 may be directly connected to the upper portion of the core 21, and the other of the terminals 131 may be connected to the connection electrode 212.

Fifth Embodiment

Figure 20:
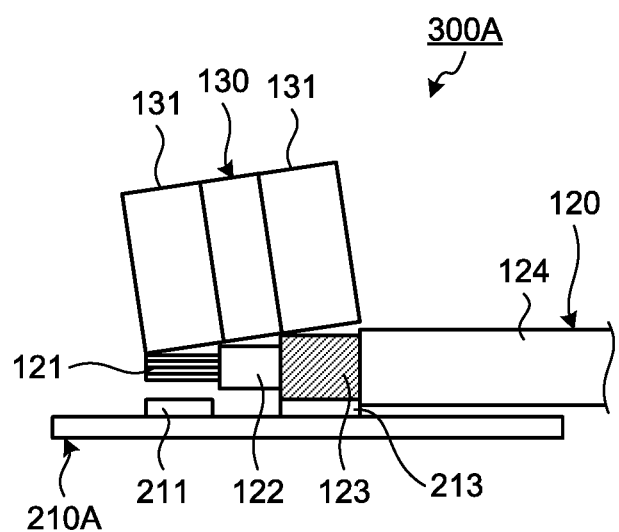
FIG. 20 is a side view of an electronic circuit module according to a fifth embodiment of the present invention.

In an electronic circuit module according to a fifth embodiment of the present invention, terminals of an electronic component are respectively connected onto a core and a shield line of a coaxial cable. FIG. 20 is a side view of the electronic circuit module according to the fifth embodiment of the present invention.

An electronic circuit module 300A according to the fifth embodiment of the present invention includes the coaxial cable 120 in which the core 121, the internal insulator 122, and the shield line 123 are exposed in a stepwise fashion, the electronic component 130 including the terminals 131 on the opposed faces, and a substrate 210A on which the electrode portions 211 and 213 are formed. The core 121 and the shield line 123 are respectively connected to the electrode portions 211 and 213. In the electronic circuit module 300A, the exposed portions of the core 121 and the shield line 123 function as a conductor portion.

In the electronic circuit module 300A, the core 121 is connected to the electrode portion 211 by solder, and the shield line 123 is connected to the electrode portion 213 by solder. The electronic component 130 is directly connected onto the core 121 in which one of the terminals 131 is connected to the electrode portion 211, by solder, and is directly connected onto the shield line 123 in which the other terminal 131 is connected to the electrode portion 213, by solder.

In the electronic circuit module 300A according to the fifth embodiment, it is possible to reduce the area required for mounting the coaxial cable 120 and the electronic component 130 onto the substrate 210A, and thus, it is possible to provide the downsized electronic circuit module 300A.

Figure 21A:
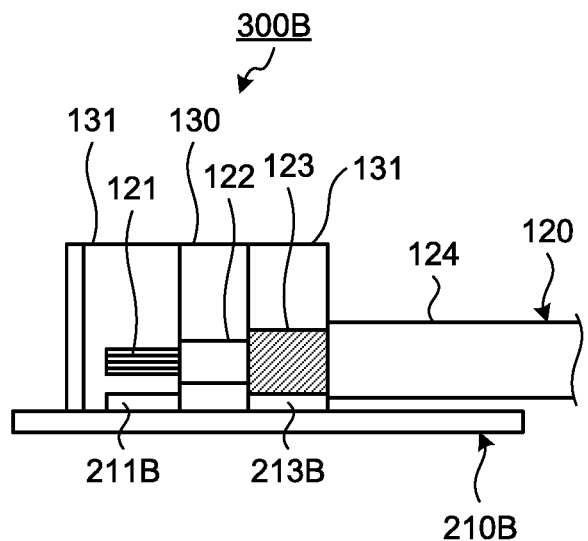
FIG. 21A is a side view of an electronic circuit module according to a first modification of the fifth embodiment of the present invention.
Figure 21B:
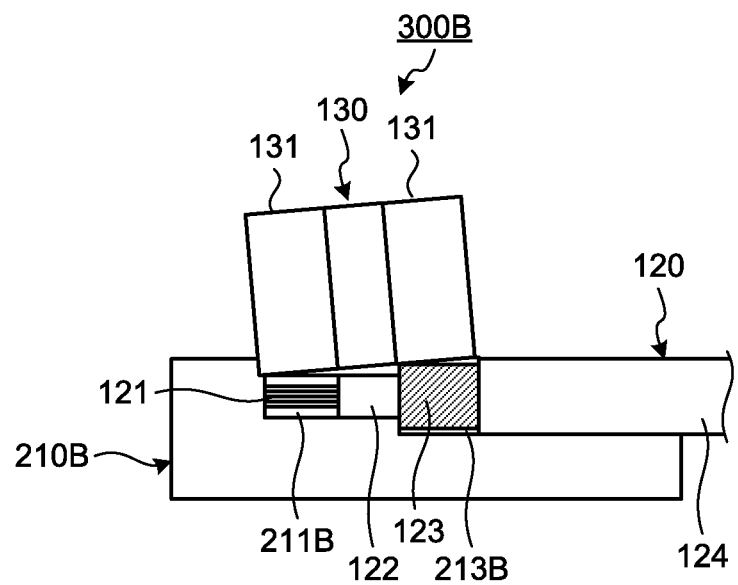
FIG. 21B is a top view of the electronic circuit module according to the first modification of the fifth embodiment of the present invention.
Figure 21C:
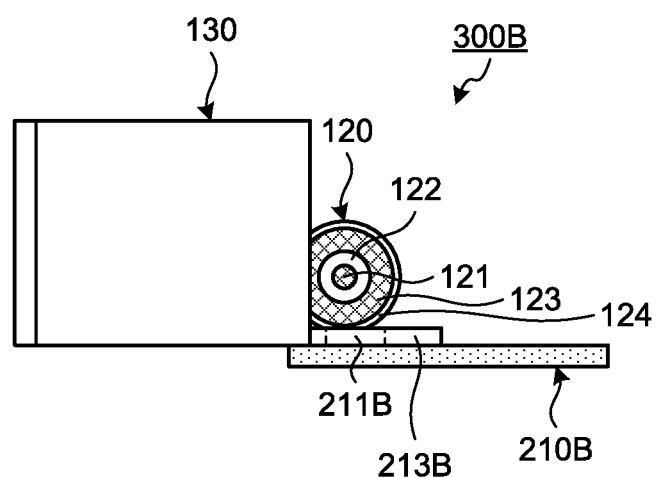
FIG. 21C is a front view of the electronic circuit module according to the first modification of the fifth embodiment of the present invention.

In the electronic circuit module 300A according to the fifth embodiment, the electronic component 130 is connected to the coaxial cable 120 on an upper side, that is, the coaxial cable 120 on a side opposite to the substrate 210A, and may be connected to the coaxial cable 120 on the side. FIG. 21A is a side view of an electronic circuit module according to a first modification of the fifth embodiment of the present invention. FIG. 21B is a top view of the electronic circuit module according to the first modification of the fifth embodiment of the present invention. FIG. 21C is a front view of the electronic circuit module according to the first modification of the fifth embodiment of the present invention.

In an electronic circuit module 300B, the core 121 is connected to an electrode portion 211B by solder, and the shield line 123 is connected to an electrode portion 213B by solder. The electronic component 130 is located on the side of a substrate 210B and the coaxial cable 120, and one of the terminals 131 is directly connected to the electrode portion 211B and the core 121 by solder, and the other terminal 131 is directly connected to the electrode portion 213B and the shield line 123 by solder.

In the electronic circuit module 300B according to the first modification of the fifth embodiment, it is possible to reduce the area required for mounting the coaxial cable 120 and the electronic component 130 onto the substrate 210B, and thus, it is possible to achieve the downsized electronic circuit module 300B.

An electronic circuit module of some embodiments has a small area required for connecting a cable and an electronic component to a substrate, which makes it possible to achieve a downsized electronic circuit module.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic circuit module comprising:
    a substrate on which a wiring pattern having an electrode portion is formed;
    a cable having an external insulator and a conductor portion, at least a distal end side of the external insulator being removed to expose a conductor, an exposed portion of the conductor being defined as the conductor portion; and
    an electronic component having terminals at least on two opposed faces of the electronic component, wherein
    at least one of the terminals of the electronic component is directly connected to the conductor portion, and is configured to be electrically connected to the electrode portion through the conductor portion;
    the cable comprises at least two solid wire cables, each of which has the external insulator removed on the distal end side to expose a core,
    an exposed portion of the core is defined as the conductor portion,
    the conductor portion is connected to the electrode portion, and
    the electronic component is directly connected to one side of the conductor portion through each of the terminals, an opposite side of the conductor portion being in contact with the electrode portion.

2. The electronic circuit module according to claim 1, wherein the cable comprises at least two solid wire cables, each of which has the external insulator that is removed on the distal end side to define an exposed portion of a core as a first conductor portion and is removed on a base end side from the first conductor portion to define another exposed portion of the core as a second conductor portion, the second conductor portion is connected to the electrode portion, and the electronic component is directly connected to the first conductor portion through each of the terminals.

3. The electronic circuit module according to claim 2, further comprising an optical component or another electronic component on the substrate, wherein the cable is bent between the first conductor portion and the second conductor portion along a back side of the optical component or another electronic component.

4. The electronic circuit module according to claim 1, wherein the cable comprises at least two solid wire cables, each of which has the external insulator that is removed on the distal end side to define an exposed portion of a core as a first conductor portion and is removed on a base end side from the first conductor portion to define another exposed portion of the core as a second conductor portion, the first conductor portion is connected to the electrode portion, and the electronic component is directly connected to the second conductor portion through each of the terminals.

5. The electronic circuit module according to claim 1, wherein the substrate is a flexible printed circuit board having an opening, the electrode portion includes flying leads bridging the opening, and the conductor portion is connected to the electrode portion.

6. The electronic circuit module according to claim 1, wherein the substrate is a flexible printed circuit board having the electrode portion including flying leads extending from an end portion of the flexible printed circuit board, and the conductor portion is connected to the electrode portion.

7. The electronic circuit module according to claim 1, wherein the cable comprises one coaxial cable having a core and a shield line, the core and the shield line are exposed in a stepwise fashion from an end portion of the coaxial cable, exposed portions of the core and the shield line constitute the conductor portion, and are connected to the electrode portion on the substrate, and each of the terminals of the electronic component is directly connected to the conductor portion.

8. The electronic circuit module according to claim 1, wherein the cable comprises at least two coaxial cables, each of which has a core and a shield line, the core and the shield line are exposed in a stepwise fashion from an end portion of each coaxial cable, exposed portions of the core and the shield line are connected to the electrode portion on the substrate, an exposed portion of the shield line is defined as the conductor portion, and each of the terminals of the electronic component is directly connected to the conductor portion.

9. The electronic circuit module according to claim 8, wherein each of the at least two coaxial cable has the external insulator that is removed on the distal end side to define the exposed portion of the shield line as a first conductor portion and is removed on a base end side from the first conductor portion to define another exposed portion of the shield line as a second conductor portion, the first conductor portion is connected to the electrode portion, and the electronic component is directly connected to the second conductor portion through each of the terminals.

10. The electronic circuit module according to claim 1, wherein the cable comprises at least:
a solid wire cable having the external insulator removed on the at least the distal end side to expose a core; and
a coaxial cable having a core and a shield line, at least the core and the shield line being exposed in a stepwise fashion from an end portion of the coaxial cable, wherein the core of the solid wire cable, and the core and the shield line of the coaxial cable are connected to the electrode portion on the substrate, an exposed portion of the core of the solid wire cable is defined as the conductor portion, an exposed portion of the shield line of the coaxial cable is defined as an additional conductor portion, and the terminals of the electronic component are directly connected to the conductor portion and the additional conductor portion, respectively.

11. The electronic circuit module according to claim 1, wherein the cable comprises one solid wire cable having the external insulator removed on the distal end side to expose a core, an exposed portion of the core is defined as the conductor portion, and the substrate has the electrode portion connected to the conductor portion and has a connection electrode, wherein one of the terminals of the electronic component is connected to the connection electrode on the substrate, and the other of the terminals is directly connected onto the conductor portion.

* * * * *